United States Patent
Yashima

(10) Patent No.: US 9,548,183 B2
(45) Date of Patent: Jan. 17, 2017

(54) CHARGED PARTICLE BEAM WRITING APPARATUS, AND CHARGED PARTICLE BEAM WRITING METHOD

(71) Applicant: NuFlare Technology, Inc., Yokohama (JP)

(72) Inventor: Jun Yashima, Kanagawa (JP)

(73) Assignee: NuFlare Technology, Inc., Yokohama (JP)

(*) Notice: Subject to any disclaimer, the term of this patent is extended or adjusted under 35 U.S.C. 154(b) by 350 days.

(21) Appl. No.: 14/459,470

(22) Filed: Aug. 14, 2014

(65) Prior Publication Data

US 2015/0060690 A1 Mar. 5, 2015

(30) Foreign Application Priority Data

Sep. 2, 2013 (JP) .................................. 2013-181215

(51) Int. Cl.
*H01J 37/147* (2006.01)
*H01J 37/317* (2006.01)

(52) U.S. Cl.
CPC ........ *H01J 37/1472* (2013.01); *H01J 37/3174* (2013.01); *H01J 2237/31725* (2013.01); *H01J 2237/31776* (2013.01)

(58) Field of Classification Search
USPC ...................................... 250/492.22, 492.23
See application file for complete search history.

(56) References Cited

U.S. PATENT DOCUMENTS

| 2009/0168043 A1* | 7/2009 | Lee .................. G03B 27/32 355/77 |
| 2010/0237253 A1 | 9/2010 | Yashima |
| 2012/0211674 A1 | 8/2012 | Kato |

(Continued)

FOREIGN PATENT DOCUMENTS

| JP | 6-267834 | 9/1994 |
| JP | 2010-219482 | 9/2010 |

(Continued)

OTHER PUBLICATIONS

Office Action issued Dec. 1, 2015 in Korean Patent Application No. 10-2014-0112300 (with English language translation).

(Continued)

*Primary Examiner* — Kiet T Nguyen
(74) *Attorney, Agent, or Firm* — Oblon, McClelland, Maier & Neustadt, L.L.P.

(57) ABSTRACT

Charged particle beam writing apparatus includes a first generation unit to generate a smallest deflection region layer in three or more deflection region layers each having deflection regions of a size different from those of other deflection region layers, for each of a plurality of figure types variably shapable using first and second shaping apertures, an assignment unit to assign each of a plurality of shot figure patterns to deflection regions of the smallest deflection region layer of a corresponding one of the plurality of figure types, a correction unit to correct, by shifting the position of each smallest deflection region layer, according to a variable shaping position of each figure type, and a writing unit to write each of the plurality of shot figure patterns on a target object, in a state where the position of each smallest deflection region layer has been corrected for each figure type.

13 Claims, 8 Drawing Sheets

(56) References Cited

U.S. PATENT DOCUMENTS

2012/0211676 A1 8/2012 Kamikubo
2013/0264499 A1* 10/2013 Nishimura .............. H01J 37/30
　　　　　　　　　　　　　　　　　　　　　　　250/492.22

FOREIGN PATENT DOCUMENTS

KR　10-2012-0095298 A　8/2012
KR　10-2012-0095308 A　8/2012

OTHER PUBLICATIONS

Taiwanese Office Action issued Mar. 29, 2016 in Patent Application No. 103126747 (with English Translation).
Taiwanese Office Action issued Jul. 6, 2016 in Patent Application No. 103126747 (with English Translation).

* cited by examiner

FIG. 4A
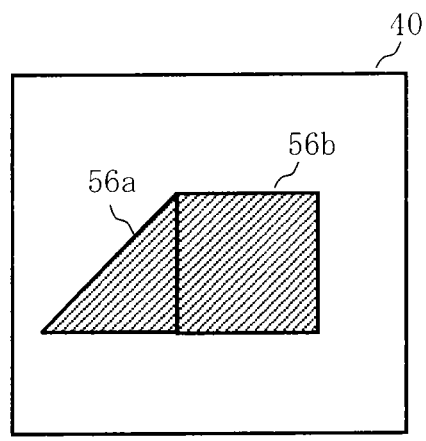
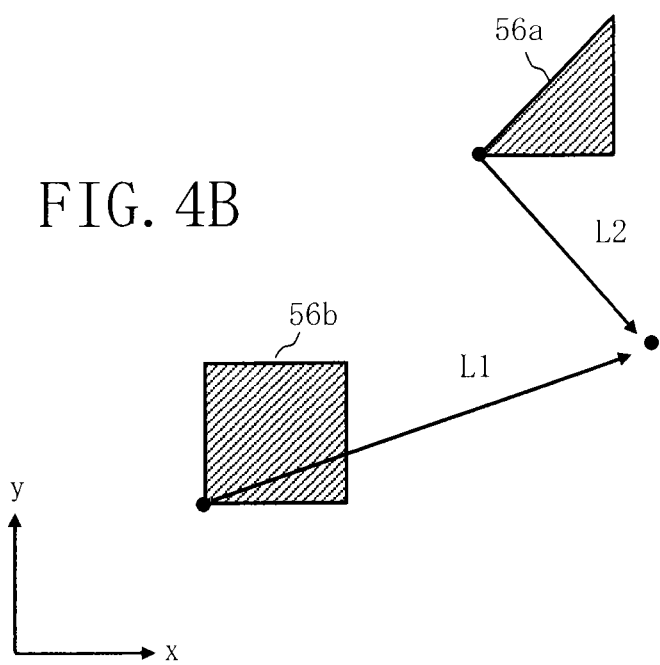
FIG. 4B

FIG. 7A
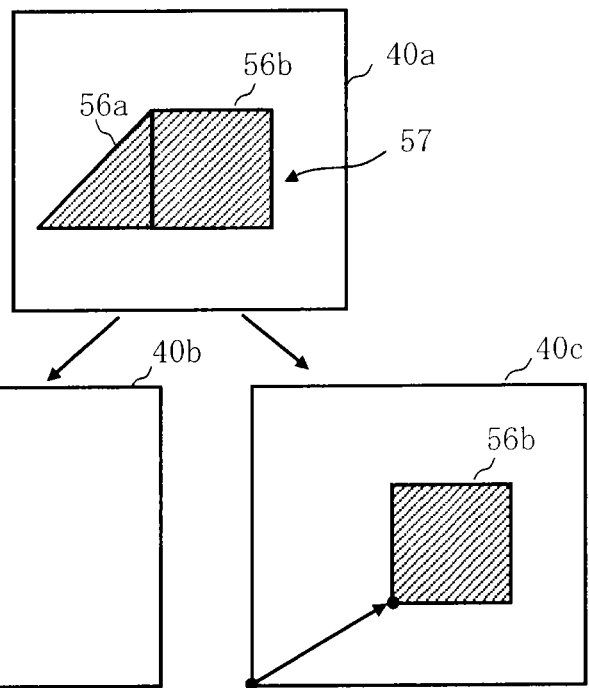
FIG. 7B
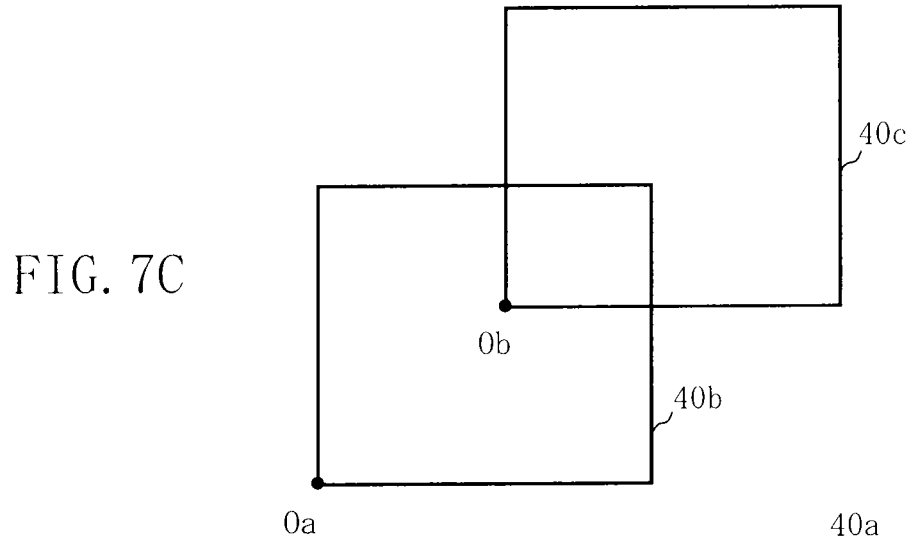
FIG. 7C
FIG. 7D
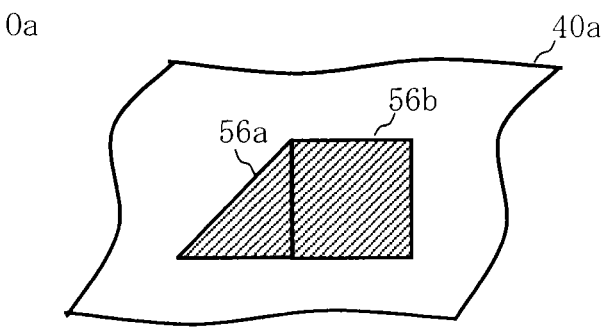

CHARGED PARTICLE BEAM WRITING APPARATUS, AND CHARGED PARTICLE BEAM WRITING METHOD

CROSS-REFERENCE TO RELATED APPLICATION

This application is based upon and claims the benefit priority from the prior Japanese Patent Application No. 2013-181215 filed on Sep. 2, 2013 in Japan, the entire contents of which are incorporated herein by reference.

BACKGROUND OF THE INVENTION

Field of the Invention

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 8 is a conceptual diagram explaining operations of a variable shaping type electron beam writing or "drawing" apparatus. The variable shaping electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during the writing. In other words, a quadrangular shape that can pass through both the aperture 411 and the variable shape aperture 421 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In the variable shaped beam system, the shape and size of a beam is determined by firstly shaping the beam, for example, into a quadrangular beam by letting it pass through the first shaping aperture, and then adjusting the position of the quadrangular beam to be deflected to the opening of the second aperture. Therefore, the position of the beam after being shaped differs depending upon the figure type. Accordingly, for applying a beam after being shaped to a desired position on the mask, it is necessary to reverse the beams deflected to different positions for beam shaping. However, there is a limitation to the deflectable range to be deflected by a deflector. Therefore, when deflecting a shaped beam onto a mask, deviation of the deflectable region occurs depending upon the figure type even when the same deflector is used for deflection. The overlapped region where deflectable regions of figures are overlapped with each other is a region deflectable with respect to all the figure types. Since the deflection region deflectable by the deflector is limited to the region deflectable with respect to all the figure types, there is a problem in that the deflection region is small.

In order to cope with this problem, conventionally, it has been examined a method in which when generating shot data for each shot, correction is performed by moving the position on the shot data according to the figure type to be shaped (e.g., refer to Japanese Published Unexamined Application (JP-A) No. 2010-219482). However, this method needs to perform calculation processing for correcting the shot data itself. In the variable shaped beam system, it is difficult to write a figure pattern serving as a writing target at a time, and therefore, each figure pattern is divided into a plurality of shot figures each having a size that can be irradiated by one shot so as to combine them to write a desired figure pattern. Therefore, the number of a plurality of shot figures obtained by dividing a figure pattern is enormous. Then, shot data is generated for each of the enormous number of shot figures. Accordingly, when correcting the position on the shot data, since movement calculation processing of each position is performed for each shot, a new problem occurs in that the calculation processing time in generating shot data increases.

On the other hand, not regarding the variable shaped beam system but regarding a character projection system of the writing apparatus, there is disclosed a method of dividing a writing region into subfields and correcting the subfield origin position according to a character shape (e.g., refer to Japanese Published Unexamined Application (JP-A) No. 6-267834). However, if applying this method to the variable shaped beam system, another new problem occurs. Deflection speed of subfield deflection is, for example, ten times as slow as that of the shaping deflection. Therefore, if the operation (deflection operation) of moving the origin position of the subfield is performed in each shot, there is a problem that the throughput of writing processing decreases greatly.

BRIEF SUMMARY OF THE INVENTION

According to one aspect of the present invention, a charged particle beam writing apparatus includes a first generation unit configured to generate a smallest deflection region layer in three or more deflection region layers each having deflection regions of a size different from those of other deflection region layers, for each figure type of a plurality of figure types which can be variably shaped using a first shaping aperture and a second shaping aperture, an assignment unit configured to assign each of a plurality of shot figure patterns to deflection regions of the smallest deflection region layer of a corresponding one of the plurality of figure types, a correction unit configured to perform correction to shift a position of each of the smallest deflection region layer, in accordance with a variable shaping position of the each figure type, and a writing unit configured to write the each of the plurality of shot figure patterns on a target object with a charged particle beam, in a state where the position of the each of the smallest deflection region layer has been corrected for the each figure type.

According to another aspect of the present invention, a charged particle beam writing method includes generating a smallest deflection region layer in three or more deflection region layers each having deflection regions of a size different from those of other deflection region layers, for each figure type of a plurality of figure types which can be variably shaped using a first shaping aperture and a second shaping aperture, assigning each of a plurality of shot figure patterns to the deflection regions of the smallest deflection region layer of a corresponding one of the each figure type, correcting to shift a position of each of the smallest deflection region layer, in accordance with a variable shaping position of the each figure type, and writing the each of the plurality of shot figure patterns on a target object with a charged particle beam, in a state where the position of the each of the smallest deflection region layer has been corrected for the each figure type.

BRIEF DESCRIPTION OF THE DRAWINGS

FIGS. 4A and 4B show an example of an irradiation position on a target object and a reverse amount according to the first embodiment;

FIGS. 7A to 7D show examples of a configuration of a TF and a shot figure according to the first embodiment.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Moreover, a variable shaping type electron beam writing apparatus will be described as an example of a charged particle beam apparatus.

In the embodiment below, there will be described a writing apparatus and method that can reverse a shaped beam while inhibiting decrease of throughput without correcting a position for beam reverse for each shot figure on shot data.

First Embodiment

Figure 1:
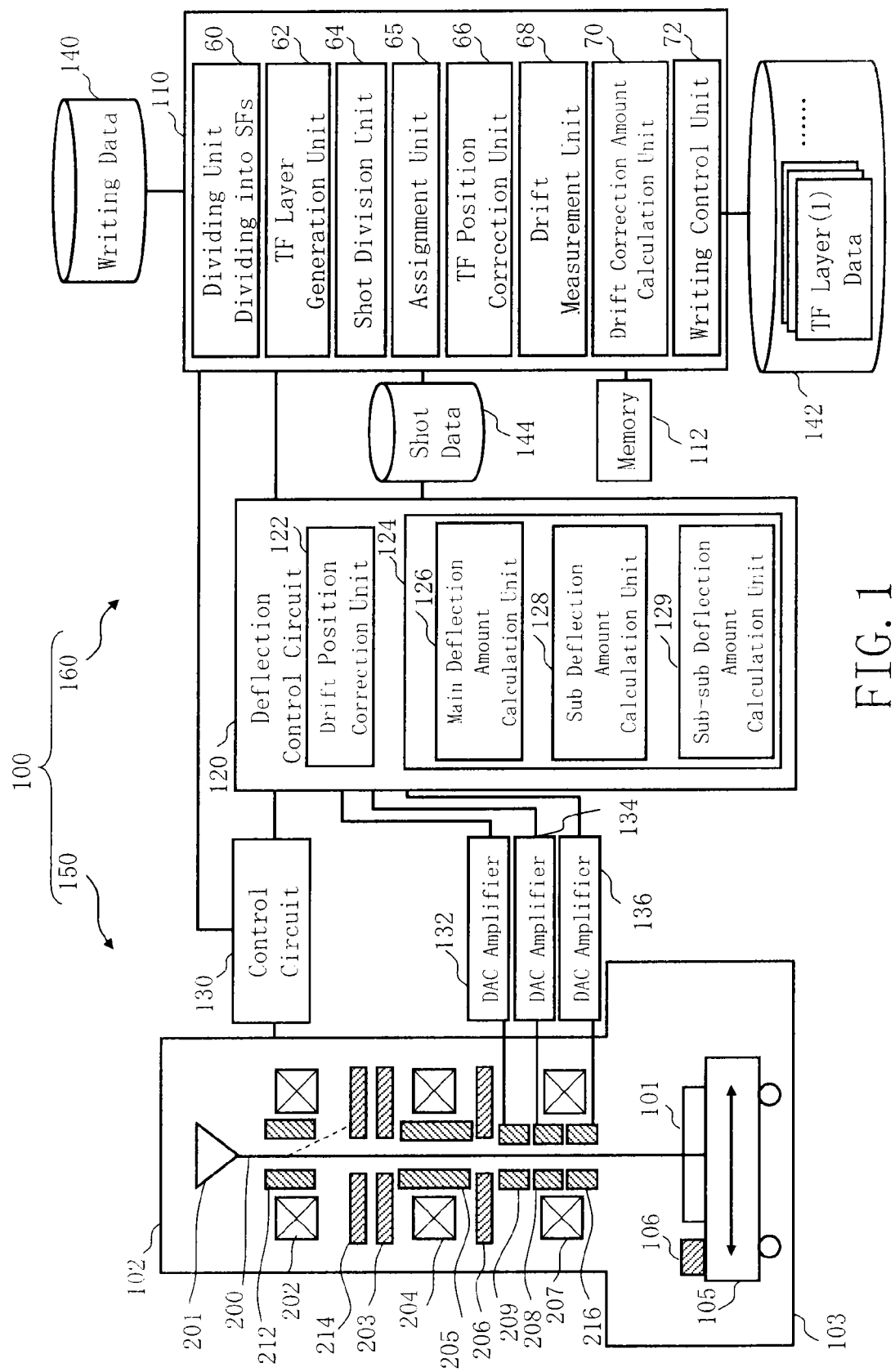
FIG. 1 is a conceptual diagram showing the configuration of a writing apparatus according to the first embodiment.

FIG. 1 is a conceptual diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, it is an example of a variable shaping type electron beam writing apparatus. The writing unit 150 includes an electron optical column 102 and a writing chamber 103. In the electron optical column 102, there are arranged an electron gun assembly 201, an illumination lens 202, a blanking deflector 212, a blanking aperture 214, a first aperture plate 203, a projection lens 204, a shaping deflector 205, a second aperture plate 206, an objective lens 207, a main deflector 208, a sub deflector 209 and a sub-sub deflector 216. In the writing chamber 103, there is arranged an XY stage 105, on which a target object or "sample" 101 such as a mask serving as a writing target is placed when performing writing. The target object 101 is, for example, an exposure mask used for manufacturing semiconductor devices. The target object 101 may be, for example, a mask blank on which resist is applied and a pattern has not yet been formed. A mark 106 for measuring a beam position is formed on the surface of the XY stage 105. The mark 106 is arranged at a position different from the position where the target object 101 is arranged.

The control unit 160 includes a control computer 110, a memory 112, a deflection control circuit 120, a control circuit 130, digital analog converter (DAC) amplifiers 132, 134, and 136, and storage devices 140, 142, and 144 such as magnetic disk drives. The control computer 110, the memory 112, the deflection control circuit 120, the control circuit 130, and the storage devices 140, 142, and 144 are connected with each other through a bus (not shown). The DAC amplifiers 132, 134, and 136 are connected to the deflection control circuit 120. The DAC amplifier 132 is connected to the sub deflector 209. The DAC amplifier 134 is connected to the main deflector 208. The DAC amplifier 136 is connected to the sub-sub deflector 216.

In the control computer 110, there are arranged a dividing unit 60 for dividing into SFs, a TF layer generation unit 62, a shot division unit 64, an assignment unit 65, a TF position correction unit 66, a drift measurement unit 68, a drift correction amount calculation unit 70, and a writing control unit 72. Functions such as the dividing unit 60 for dividing into SFs, the TF layer generation unit 62, the shot division unit 64, the assignment unit 65, the TF position correction unit 66, the drift measurement unit 68, the drift correction amount calculation unit 70, and the writing control unit 72 may be configured by hardware such as an electric circuit, or by software such as a program causing a computer to implement these functions. Alternatively, they may be configured by a combination of software and hardware. Data which is input and output to/from the control computer 110 and data being calculated are stored in the memory 112 each time.

In the deflection control circuit 120, there are arranged a drift position correction unit 122 and a deflection amount calculation unit 124. Functions, such as the drift position correction unit 122 and the deflection amount calculation unit 124 may be configured by hardware such as an electric circuit, or by software such as a program causing a computer to implement these functions. Alternatively, they may be configured by a combination of software and hardware. In the deflection amount calculation unit 124, there are arranged a main deflection amount calculation unit 126, a sub-deflection amount calculation unit 128, and a sub-sub-deflection amount calculation unit 129. Functions, such as the main deflection amount calculation unit 126, the sub-deflection amount calculation unit 128, and the sub-sub-deflection amount calculation unit 129 may be configured by hardware such as an electric circuit, or by software such as a program causing a computer to implement these functions. Alternatively, they may be configured by a combination of software and hardware. Data which is input and output to/from the drift position correction unit 122 and the deflection amount calculation unit 124 and data being calculated are stored in the memory (not shown) each time.

Figure 2:
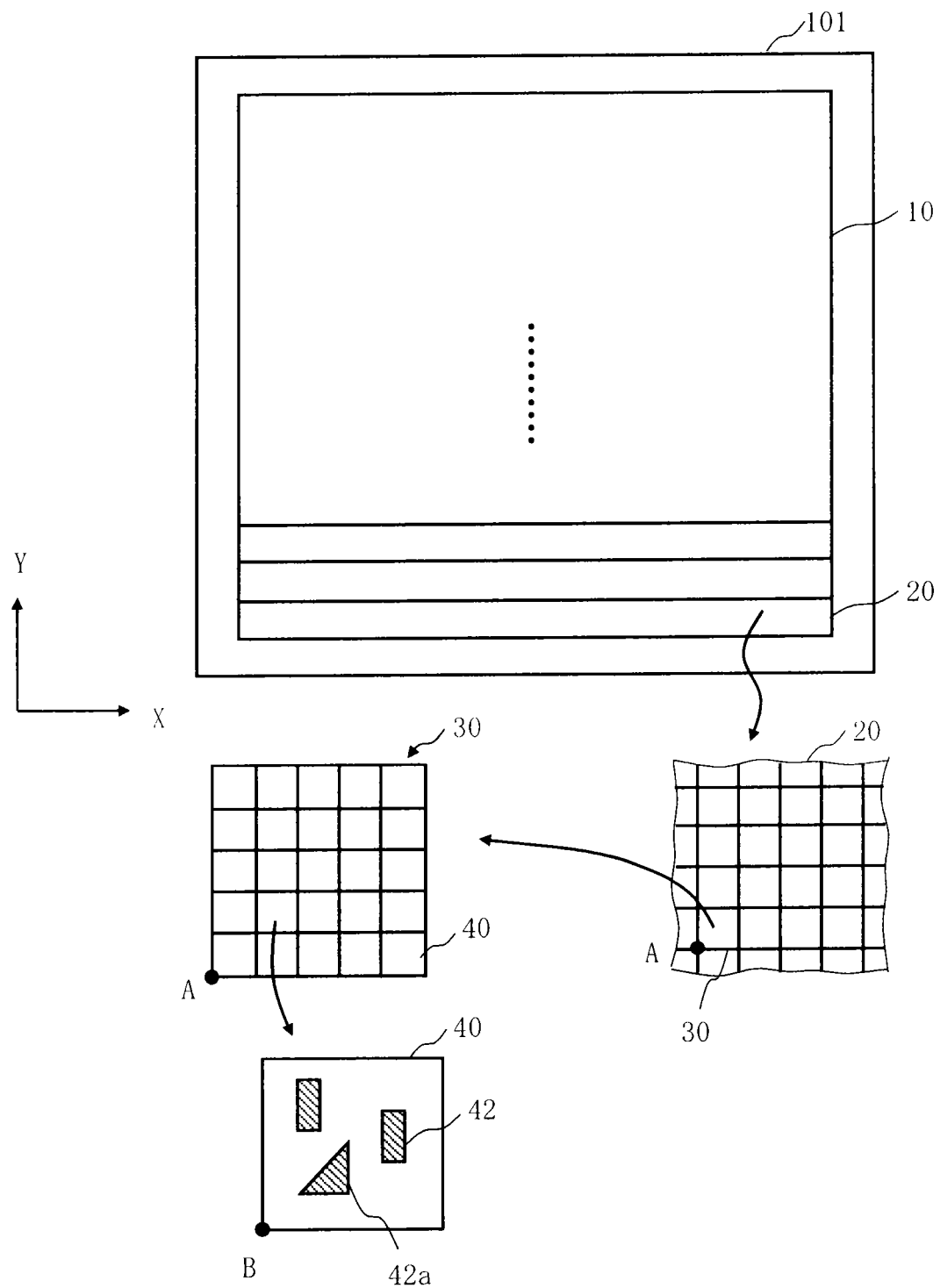
FIG. 2 is a conceptual diagram explaining each region according to the first embodiment.

FIG. 2 is a conceptual diagram explaining each region according to the first embodiment. In FIG. 2, a writing region 10 of the target object 101 is virtually divided into a plurality of strip-shaped stripe regions 20, which are aligned along the y direction, for example, by the width deflectable by the main deflector 208. Then, each stripe region 20 is virtually divided into a plurality of mesh-like subfields (SF) 30 (small regions) by the size deflectable by the sub deflector 209. Then, each SF 30 is divided by the size deflectable by the sub-sub deflector 216 into a plurality of mesh-like under subfields (USFs) 40 (small regions), where the USF is referred to as "TF" being an abbreviation of Tertiary Field that indicates the third deflection region. A shot figure pattern is written at each of the shot positions 42 in each TF 40.

A digital signal for main deflection control is output from the deflection control circuit 120 to the DAC amplifier 134. The DAC amplifier 134 converts the digital signal to an analog signal and amplifies it to be applied as a deflection voltage to the main deflector 208. The electron beam 200 is deflected by the deflection voltage, and thereby each beam shot is deflected to a reference position of a predetermined subfield (SF) obtained by virtual division into mesh-like regions.

A digital signal for sub-deflection control is output from the deflection control circuit 120 to the DAC amplifier 132. The DAC amplifier 132 converts the digital signal to an analog signal and amplifies it to be applied as a deflection voltage to the sub deflector 209. The electron beam 200 is deflected by the deflection voltage, and thereby each beam shot is deflected to a reference position of a TF 40 being the smallest deflection region made by further virtually dividing a predetermined SF 30 into mesh-like regions, where the SF 30 has been obtained by virtual division into mesh-like regions.

A digital signal for sub-sub-deflection control is output from the deflection control circuit 120 to the DAC amplifier 136. The DAC amplifier 136 converts the digital signal to an analog signal and amplifies it to be applied as a deflection voltage to the sub-sub deflector 216. The electron beam 200 is deflected by the deflection voltage, and thereby each beam shot is deflected to each shot position in the TF 40 being the smallest deflection region.

The writing apparatus 100 performs writing processing for each stripe region 20 by using a multi-stage deflector. In this case, a three-stage deflector composed of the main deflector 208, the sub deflector 209 and the sub-sub deflector 216 is used as an example. While the XY stage 105 is continuously moving in the −x direction, for example, writing is performed in the x direction. in the first stripe region 20. After the first stripe region 20 has been written, writing is performed similarly or in the opposite direction in the second stripe region 20. Then, in the same way, writing is performed in the third and subsequent stripe regions 20. The main deflector 208 (the first deflector) deflects the electron beam 200, in order, to a reference position A of the SF 30 such that the movement of the XY stage 105 is followed. The sub deflector 209 (the second deflector) deflects the electron beam 200, in order, from the reference position A of each SF 30 to a reference position B of the TF 40. Further, the sub-sub deflector 216 (the third deflector) deflects the electron beam 200 from the reference position B of each TF 40 to a shot position 42 of an irradiating beam in the TF 40 concerned. Thus, the sizes of the deflection regions of the main deflector 208, the sub deflector 209, and the sub-sub deflector 216 are different from each other. The TF 40 is the smallest deflection region in the deflection regions of this multi-stage deflector.

Figure 3:
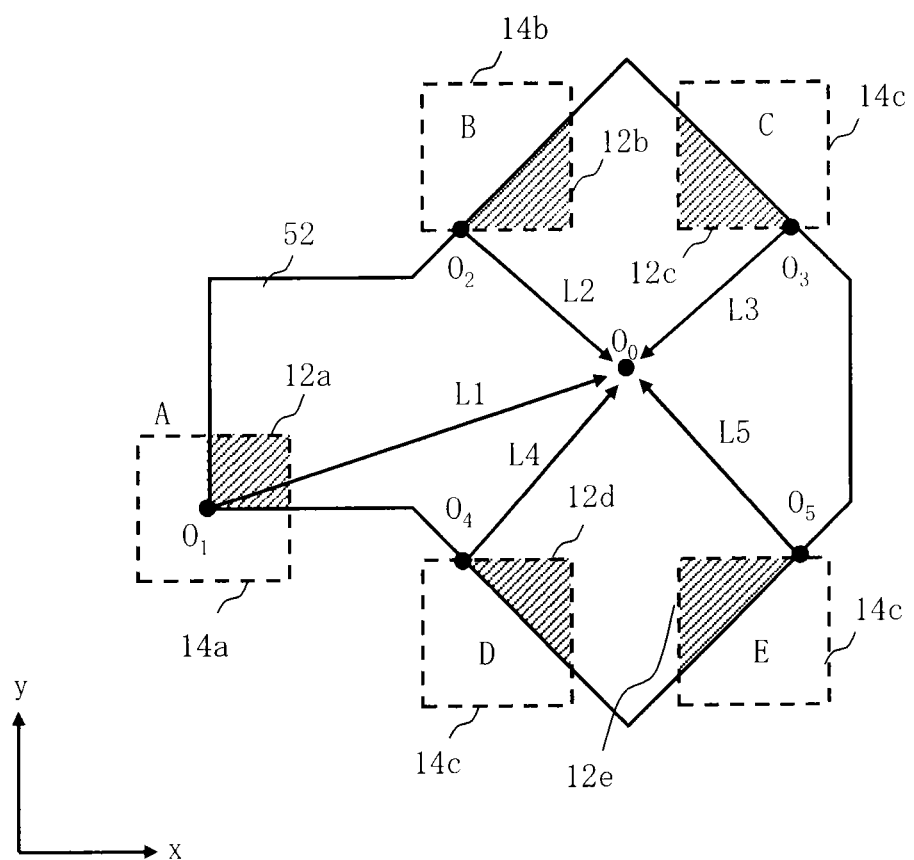
FIG. 3 shows an example of a shaping opening of a variable shape aperture and a beam to be shaped variably according to the first embodiment.

FIG. 3 shows an example of a shaping opening of a variable shape aperture and a beam to be shaped variably according to the first embodiment. In FIG. 3, a shaping opening 52, which is formed by connecting one side of a rectangle and one side of a hexagon, is formed in the second aperture plate 206. The shaping opening 52 is formed to be a figure, each of whose angles of apexes is an integral multiple of 45 degrees, for example.

FIG. 3 shows an example of a position where a first shaping aperture image 14 which has passed through the opening portion of the first aperture plate 203 and the shaping opening 52 of the second aperture plate 206 are overlapped. If the electron beam 200 is not deflected by the shaping deflector 205, the first shaping aperture image 14 is projected onto a central position, for example denoted by $O_0$, of the shaping opening 52. For example, when shaping the electron beam 200 into a quadrangle, such as a square or a rectangle, the first shaping aperture image 14 is deflected by the shaping deflector 205 to be projected onto the position denoted by A. Then, the portion shown in shadow lines in the projected image, which is to pass through the shaping opening 52, becomes a second shaping aperture image 12a. The distance between a reference position $O_1$ of the quadrangular second shaping aperture image 12a and the center $O_0$ of the shaping opening 52 is a distance $L_1$.

Moreover, for example, when shaping the electron beam 200 into an isosceles right triangle whose right angle corner is located at the bottom left in FIG. 3, the first shaping aperture image 14 is deflected by the shaping deflector 205 to be projected onto the position denoted by B. Then, the portion shown in shadow lines in the projected image, which is to pass through the shaping opening 52, becomes a second shaping aperture image 12b. The distance between a reference position $O_2$ of the second shaping aperture image 12b being the isosceles right triangle and the center $O_0$ of the shaping opening 52 is a distance $L_2$.

Moreover, for example, when shaping the electron beam 200 into an isosceles right triangle whose right angle corner is located at the bottom left in FIG. 3, the first shaping aperture image 14 is deflected by the shaping deflector 205 to be projected onto the position denoted by C. Then, the portion shown in shadow lines in the projected image, which is to pass through the shaping opening 52, becomes a second shaping aperture image 12c. The distance between a reference position $O_3$ of the second shaping aperture image 12c being the isosceles right triangle and the center $O_0$ of the shaping opening 52 is a distance $L_3$.

Moreover, for example, when shaping the electron beam 200 into an isosceles right triangle whose right angle corner is located at the top right in FIG. 3, the first shaping aperture image 14 is deflected by the shaping deflector 205 to be projected onto the position denoted by D. Then, the portion shown in shadow lines in the projected image, which is to pass through the shaping opening 52, becomes a second shaping aperture image 12d. The distance between a reference position $O_4$ of the second shaping aperture image 12d being the isosceles right triangle and the center $O_0$ of the shaping opening 52 is a distance $L_4$.

Moreover, for example, when shaping the electron beam 200 into an isosceles right triangle whose right angle corner is located at the top left in FIG. 3, the first shaping aperture image 14 is deflected by the shaping deflector 205 to be projected onto the position denoted by E. Then, the portion shown in shadow lines in the projected image, which is to pass through the shaping opening 52, becomes a second shaping aperture image 12e. The distance between a reference position $O_5$ of the second shaping aperture image 12e being the isosceles right triangle and the center $O_0$ of the shaping opening 52 is a distance $L_5$.

In the example of FIG. 3, the irradiation position $O_0$ of the first shaping aperture image 14 in the case of not deflecting the electron beam 200 by the shaping deflector 205 is defined to be the central position of the shaping aperture 52, but however, it is not limited thereto. Thus, other position, such as a position not in the range of the shaping aperture 52, may be the irradiation position $0_0$ of the first shaping aperture image 14. At any rate, as shown in FIG. 3, the position of the electron beam irradiating the second shaping aperture plate 206 varies depending upon the figure type shaped.

FIGS. 4A and 4B show an example of an irradiation position on the target object and a reverse amount according to the first embodiment. FIG. 4A shows the case of forming a pattern where one side of an isosceles right triangle 56a whose right angle corner is located at the bottom right is connected with a quadrangle 56b in the TF 40 on the target object 101. In that case, since the positions where they were beam-shaped are different from each other, it is necessary to reverse (move, or correct) the reference position of the isosceles right triangle 56a after being beam-shaped to the reference point $0_0$ which is away by the distance $L_2$ as shown in FIG. 4B. Similarly, it is necessary to reverse (move, or correct) the reference position of the quadrangle 56b after being beam-shaped to the reference point $O_0$ which is away by the distance $L_1$.

Figure 5:
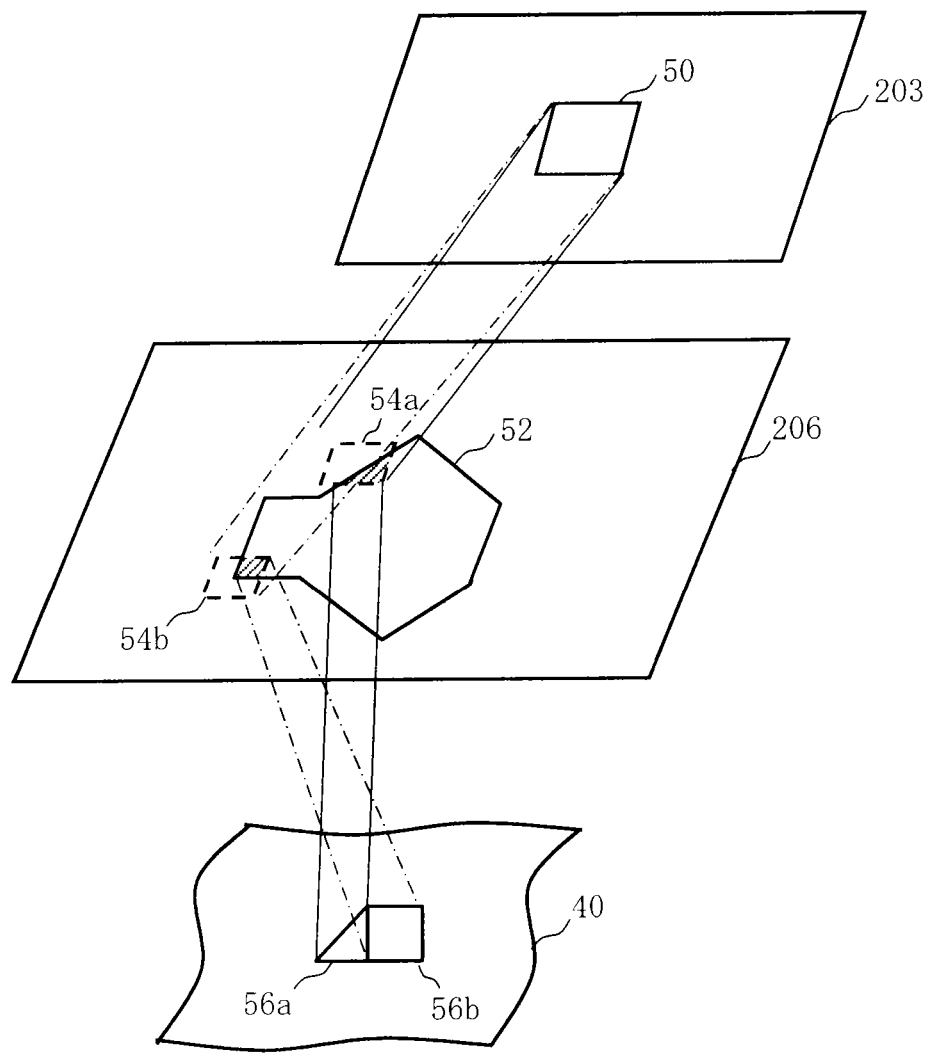
FIG. 5 shows an example of a shot beam orbit according to the first embodiment.

FIG. 5 shows an example of a shot beam orbit according to the first embodiment. When forming the pattern shown in FIG. 4A on the TF 40 of the target object 101, the two shot figures of the isosceles right triangle and the quadrangle are shaped in order and projected onto the TF 40 each time. The first shaping aperture image 54a having passed through an aperture 50 of the first shaping aperture plate 203 is projected by the shaping deflector 205 to the position extending over the oblique side located at the upper left of the shaping apertures 52 of the second shaping aperture plate 206. Thereby, the shot FIG. 56a being the isosceles right triangle whose right angle corner is located at the bottom right can be shaped. Then, the beam of the shot FIG. 56a being the shaped isosceles right triangle is deflected to a desired position in the TF 40 by the main deflector 208, the sub deflector 209, and the sub-sub deflector 216. In that case, a deviation amount of the shaping position has been corrected (reversed). Then, the quadrangle is shaped by the next shot. The first shaping aperture image 54b having passed through the aperture 50 of the first shaping aperture plate 203 is projected by the shaping deflector 205 to the position extending over two sides at the right angle corner of the quadrangular opening part at the left of the shaping apertures 52 of the second shaping aperture plate 206. Thereby, the quadrangular shot FIG. 56b can be shaped. Then, the beam of the shaped quadrangular shot FIG. 56b is deflected to a desired position in the TF 40 by the main deflector 208, the sub deflector 209, and the sub-sub deflector 216. In that case, a deviation amount of the shaping position has been corrected (reversed). According to the first embodiment, reverse correction of deviation of the shaping position is performed using the TF 40.

Figure 6:
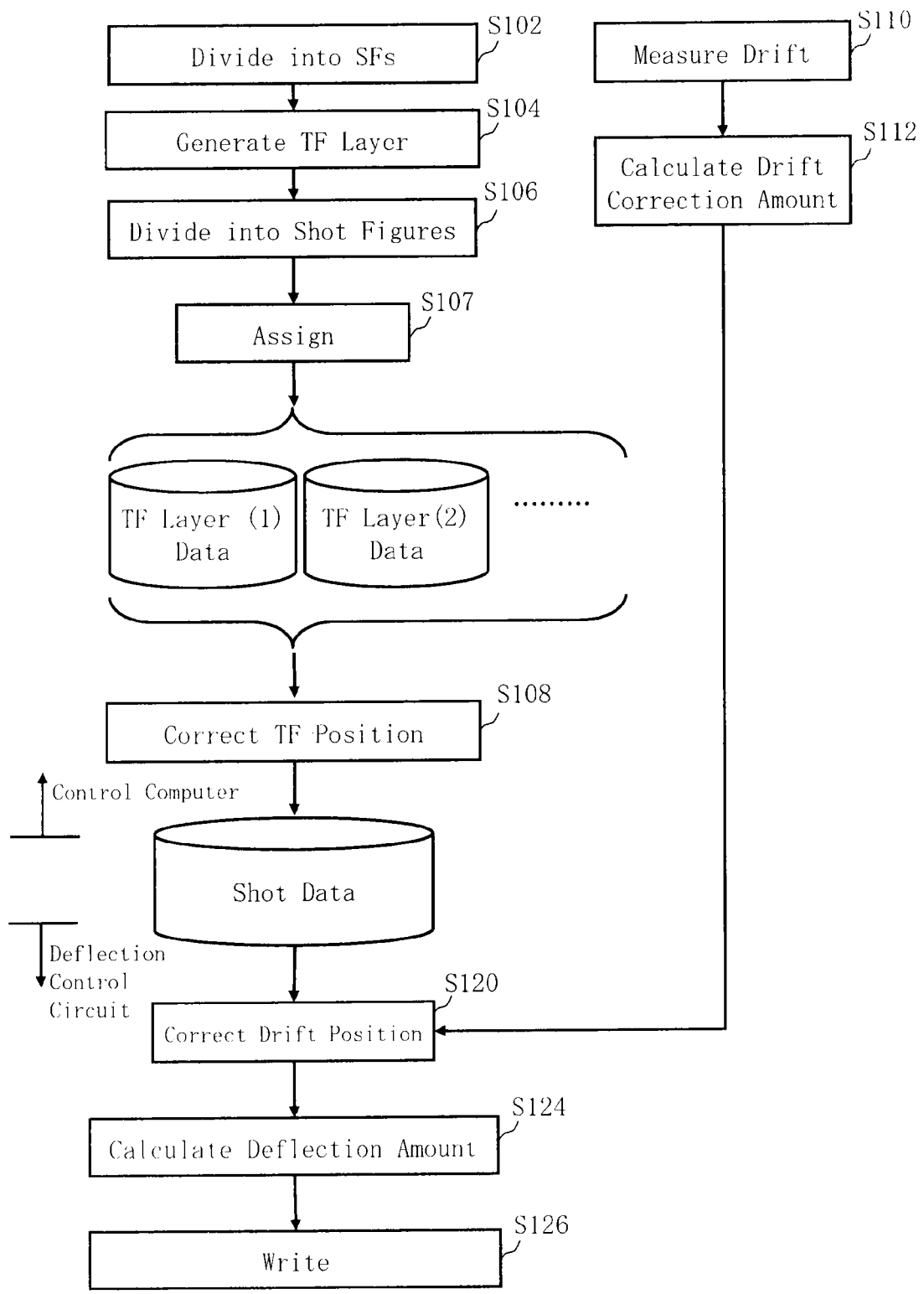
FIG. 6 is a flowchart showing the main steps of a writing method according to the first embodiment.
Figure 8:
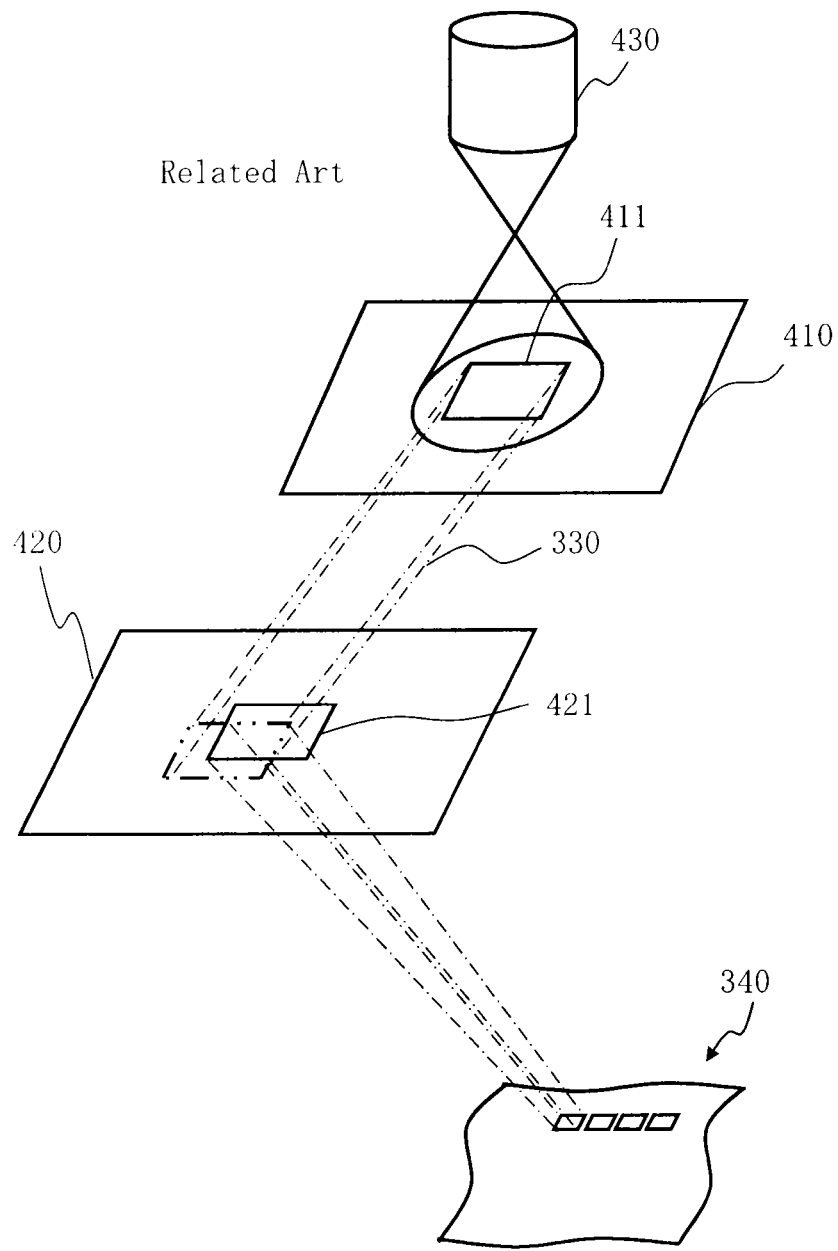
FIG. 8 is a conceptual diagram explaining operations of a variable shaping type electron beam writing apparatus.

FIG. 6 is a flowchart showing the main steps of a writing method according to the first embodiment. In FIG. 6, the writing method of the first embodiment executes a series of steps: a dividing step (S102) of dividing into SFs, a TF layer generation step (S104), a shot division step (S106), an assignment step (S107), a TF position correction step (S108), a drift measurement step (S110), a drift correction amount calculation step (S112), a drift position correction step (S120), a deflection amount calculation step (S124), and a writing step (S126).

In the dividing step (S102) of dividing into SFs, the SF division unit 60 virtually dividing the writing region 10 of the target object 101 into a plurality of mesh-like SFs 30 by the size deflectable by the sub deflector 209. The processing of dividing into SFs may indicate to virtually divide each stripe region 20 described above into a plurality of SFs 30, or to virtually divide the writing region 10 of the target object 101 into a plurality of SF 30s. When performing one pass writing, it is sufficient to generate one SF lay. When performing multi-pass writing, what is necessary is to generate a plurality of SF layers according to the multiplicity (the number of passes). In other words, the SF division unit 60 (second generation unit) generates an SF layer which is a deflection region layer larger than the smallest deflection region layer in the three or more deflection region layers. The generated number of SF 30 layers is less than that of the TF 40 layers each being the smallest deflection region layer described later. Furthermore, the SF 30 layer is not orated for each figure type.

According to the first embodiment, the smallest deflection region layer in the three or more deflection region layers each having a different deflection region size is generated for each figure type of a plurality of figure types which can be variably shaped using the first and second shaping aperture plates 203 and 206. Specifically, it operates as follows.

In the TF layer generation step (S104), the TF layer generation unit 62 (first generation unit) generates the TF 40 layer for each figure type. For example, in the example of FIG. 3, a TF layer is generated for each of the quadrangle, the isosceles right triangle whose right angle corner is located at the bottom right, the isosceles right triangle whose right angle corner is located at the bottom left, the isosceles right triangle whose right angle corner is located at the top right, and the isosceles right triangle whose right angle corner is located at the top left. Therefore, for example, if there are five figure types, five TF layers are generated. Each TF layer is configured by a plurality of TFs 40 obtained by virtually dividing each SF 30 in the entire writing region 10 of the target object 101 or in the entire stripe region mesh-like regions by the size deflectable by the sub-sub deflector 216. Therefore, with respect to the entire writing region 10 of the target object 101 or the entire stripe region 20, a TF layer configured by a plurality of TFs 40 is generated for each figure type. The position of each TF 40 in the TF layer is defined as a relative position from the reference position of the SF 30 to which the TF 40 concerned belongs.

In the shot division step (S106), the shot division unit 64 inputs writing data from the storage device 140, performs data conversion processing of a plurality of stages, and divides a figure pattern into shot figures each for each shot. Generally, a plurality of figure patterns are defined in the writing data stored in the storage device 140. It is necessary to divide each figure pattern into a plurality of divided figure patterns each having a size that can be irradiated by one beam shot in order to write a figure pattern by the writing apparatus 100. Then, for actually performing writing, the shot division unit 64 generates a shot figure pattern by dividing each figure pattern into the size that can be irradiated by one beam shot.

In the assignment step (S107), the assignment unit 65 respectively assigns each of a plurality of shot figure patterns to a deflection region in the smallest deflection region layer of a corresponding figure type. In this case, each shot figure pattern is assigned to a TF 40 of the TF layer of a corresponding figure type.

FIGS. 7A to 7D show examples of a configuration of a TF and a shot figure according to the first embodiment. In FIG. 7A, a figure pattern 57 is arranged in one TF 40a, as a design. Since it is difficult to write the figure pattern 57 with one beam shot, the pattern is divided for each shot into a shot FIG. 56a being an isosceles right triangle whose right angle corner is located at the bottom right and a shot FIG. 56b being a quadrangle. Then, conventionally, both the shot FIG. 56a and the shot FIG. 56b are assigned to the TF 40a, but however, according to the first embodiment, assignment is performed as described below. Since the figure types of the shot FIG. 56a and the shot FIG. 56b are different from each other, according to the first embodiment as shown in FIG. 7B, the shot FIG. 56a is assigned to a corresponding TF 40b of the TF layer for the isosceles right triangles whose right angle corner is located at the bottom right. The shot FIG. 56b is assigned to a corresponding TF 40c of the TF layer for the quadrangle. TF layer data for each figure type is stored in the storage device 142.

In the TF position correction step (S108), the TF position correction unit 66 performs correction such that the position of each minimum deflection region layer is shifted in accordance with the variable shaping position of each figure type. As shown in FIG. 3, the positions for shaping on the second shaping aperture plate 206 differ for each figure type. Therefore, it becomes necessary to correct (reverse) the beam position by an amount of deviation from the reference position (for example, the center of the shaping aperture 52). According to the first embodiment, correction is performed so that the reference position of the TF layer for each figure type may be shifted in accordance with the variable shaping position for each figure type. Therefore, as shown in FIG. 7C, the TF 40b concerned in the TF layer for the isosceles right triangle whose right angle corner is located at the bottom right, and the TF 40c concerned in the TF layer for the quadrangle are both equivalent to the same TF 40a, but their positions are moved for correction only to have different positional relations. The TF position correction unit 66 is an example of a correction unit. The position of each TF 40 in the TF layer after position correction is defined as a relative position from the reference position of the SF 30 to which the TF 40 concerned before correction belongs.

As described above, shot data is generated in which each shot figure is assigned to a corresponding TF 40 whose position at the TF layer has been corrected for each figure type. Shot data is stored in the storage device 144. Shot data is generated for each shot figure pattern, and, for example, there is defined figure data, such as a corresponding TF identification number, figure type, figure size, and irradiation position in the shot data. With respect to the irradiation position, for example, a relative position from the reference position of a corresponding TF is retired. Moreover, in addition to the above, reference position data of each SF 30 and reference position data of each TF 40 of each TF layer after correction are defined as the shot data. Moreover, shot data is generated sequentially in real time in accordance with the advance of writing processing for each stripe or for each of a plurality of processing regions obtained by virtually dividing a stripe region. It is preferable for the processing region to be the size less than or equal to the stripe region and including a plurality of SFs 30.

In the deflection amount calculation step (S124), the deflection amount calculation unit 124 reads shot data from the storage device 144, and calculates a deflection amount for each deflector. The main deflection amount calculation unit 126 calculates a deflection amount for deflection to the reference position of an SF 30 concerned by the main deflector 208. The sub-deflection amount calculation unit 128 calculates a deflection amount for deflection by the sub deflector 209 from the reference position of an SF 30 concerned to the reference position of a TF 40 concerned (relative position). In that regard, with respect to the TF 40 concerned, the layer differs for each figure type, and the reference position of each TF 40 for each figure type has been corrected for each figure type as described above. The sub-sub-deflection amount calculation unit 129 calculates a deflection amount for deflection by the sub-sub deflector 216 from the reference position to the irradiation position of a TF 40 of corresponding figure type, for each shot figure pattern.

In the writing step (S126), the writing control unit 86 controls the control circuit 130, the deflection control circuit 120, etc. in order to make the writing unit 150 perform writing processing. The deflection control circuit 120 outputs a digital signal used as the main deflection data to the DAC amplifier unit 134. The DAC amplifier unit 134 converts the digital signal to an analog signal and amplifies it to be applied as a deflection voltage to the main deflector 208. Similarly, the deflection control circuit 120 outputs a digital signal used as sub-deflection data to the DAC amplifier unit 132. The DAC amplifier unit 132 converts the digital signal to an analog signal and amplifies it to be applied as a deflection voltage to the sub deflector 209. Similarly, the deflection control circuit 120 outputs a digital signal used as sub-sub deflection data to the DAC amplifier unit 136. The DAC amplifier unit 136 converts the digital signal to an analog signal and amplifies it to be applied as a deflection voltage to the sub-sub deflector 216. Under the control of the control circuit 130, the writing unit 150 writes each shot figure pattern on the target object 101 with the electron beam 200, in the state where the position of the smallest deflection region layer has been corrected for each figure type.

When the electron beam 200 emitted from the electron gun assembly 201 (an emission unit) passes through the blanking deflector 212, it is controlled by the blanking deflector 212 to pass through the blanking aperture 214 when in the "beam on" state, and to be deflected such that the entire beam is blocked by the blanking aperture 214 when in the "beam off" state. The electron beam 200 that has passed through the blanking aperture 214 during the period from the time of changing from the "beam off" state to the "beam on" state to the time of again changing to the "beam off" state serves as one shot of the electron beam. The blanking deflector 212 controls the direction of the passing electron beam 200 to alternately generate the "beam on" state and the "beam off" state. For example, no voltage should be applied when in the "beam on" state, and a voltage should be applied to the blanking deflector 212 when in the "beam off" state. The dose per shot of the electron beam 200 to irradiate the target object 101 is adjusted depending upon an irradiation time of each shot.

As described above, each shot of the electron beam 200, which is generated by passing through the blanking deflector 212 and the blanking aperture 214, irradiates the whole of the first shaping aperture plate 203 having a quadrangular opening by the illumination lens 202. Here, the electron beam 200 is first shaped to a quadrangle. Then, after having passed through the first shaping aperture plate 203, the electron beam 200 of the first aperture image is projected onto the second shaping aperture plate 206 by the projection lens 204. The first aperture image on the second shaping aperture plate 206 is deflection controlled by the shaping deflector 205 so as to change (variably shape) the beam shape and size. Such variable beam shaping is performed for each shot, and, generally, each shot is shaped to have a different shape and size. Then, after having passed through the second shaping aperture plate 206, the electron beam 200 of the second aperture image is focused by the objective lens 207, and deflected by the main deflector 208, the sub deflector 209, and the sub-sub deflector 216 to reach a desired position on the target object 101 placed on the XY stage 105 which moves continuously.

The electron beam 200 is deflected by the main deflector 208 to the reference position of an SF 30 corresponding to the current shot. Then, the electron beam 200 is deflected by the sub deflector 209 from the reference position of the SF 30 concerned to the reference position of the TF 40 concerned. A shaping position deviation of each figure type is corrected (reversed) by this deflection. The electron beam 200 is deflected by the sub-sub deflector 216 from the reference position of the TF 40 concerned to the irradiation position.

As described above, a plurality of shots of the electron beam 200 are deflected in order by each deflector onto the target object 101 serving as a substrate. Thereby, as shown in FIG. 7D, the shot FIGS. 56a and 56b as designed are projected onto desired positions in the TF 40a.

Since the size of TF 40 is smaller than that of SF 30, the deflection amount (moving extent) from the reference position of SF 30 to the reference position of TF 40 inside the SF 30 can be small. Therefore, since the dynamic range can be greatly reduced compared with the dynamic range for the SF 30, the deflection speed of the DAC amplifier 132 can be greatly increased. The deflection speed of the DAC amplifier (not shown) for shaping deflection is on the order of 100 ns, for example. On the other hand, the deflection speed during moving between SFs 30 by the DAC amplifier 134 for main deflection is on the order of several µs, for example. Therefore, this speed is about ten times as slow as the deflection speed of shaping deflection. By contrast, the deflection speed during moving between TFs 40 by the DAC amplifier 132 for sub deflection is on the order of 100 ns similar to the shaping deflection. Therefore, for example, when an SF layer is generated for each figure type and a reverse amount of each figure type is corrected by deflection to the SF 30, the shot cycle is affected and the throughput of writing processing is greatly degraded. By contrast to this, as in the first embodiment, when a TF layer is generated for each figure type and a reverse amount of each figure type is corrected by deflection to the IF 40, the shot cycle is not affected, or even when it is affected, the influence extent can be a permissible one. Therefore, the throughput of writing processing can be maintained without being reduced. Thus, in order to give a deflection speed comparable to the shaping deflection speed to the DAC amplifier, it is preferable to have three or more multi-stage deflection. Moreover, by virtue of generating a TF layer for each figure type, it becomes unnecessary to move the position of shot data of each shot figure itself. Accordingly, it becomes unnecessary to correct each position on the shot data with respect to enormous number of shot figures. Thus, increase in the calculation processing time in shot data generation can be avoided. Eventually, the throughput of writing processing can be improved. It is desirable for the deflection region to perform shaping position correction for each figure type to be a minimum deflection region where a shot figure is arranged.

Next, the first embodiment and the writing by a character projection system will be compared. When a reverse amount is large, there exists a pattern written with a beam passing the position distant from the center of a lens. This is because when a pattern of a certain type is adjusted to pass through the center of a lens, patterns of other types pass the positions shifted from the center by a function amount of the reverse amount. In such a case, under the influence of distortion of the lens, distortion may occur in a writing pattern. When determining the size of each change field, it is designed in the extent that this distortion does not affect the writing precision. Then, it is desirable for the reverse amount to be comparable in size to the TF field size, and needed to be at most smaller than the size of the sub-deflection field. In the variable shaped beam (VSB) system as in the first embodiment, in the light of design of a shaping aperture, the reverse amount is at most several µm and comparable in size to the TF size. By contrast, the reverse amount is larger in the case of the character writing. Therefore, writing precision may be affected when writing is performed by the character writing method. Thus, according to the first embodiment, the writing precision can be increased compared with writing by the character projection system.

In the first embodiment, drift correction is performed before and/or during writing.

In the drift measurement step (S110), the drift measurement unit 68 measures a drift amount of the electron beam 200 which changes as time passes. Specifically, the XY stage 105 is moved to the position where the electron beam 200 can irradiate the mark 106. As for the mark 106, a cruciform mark is used, for example. For example, the position of the mark 106 is measured by scanning the mark 106 with the electron beam 200 by the main deflector 208, the sub deflector 209, or the sub-sub deflector 216, and detecting a reflection electron or a secondary electron by a detector (not shown). Then, the drift amount of the electron beam 200 at the measurement time is measured, using stage position information measured with a position measuring device (not shown) for measuring the XY stage 105, based on deviation between the mark position obtained from the measured stage position and the mark position measured by the beam scan. It is preferable that measurement of the drift amount is performed when writing of the stripe region 20 is completed before and/or during writing. It is also preferable to perform drift amount measurement for each stripe writing. Alternatively, it may be performed whenever a predetermined plurality of stripe regions 20 have been written.

In the drift correction amount calculation step (S112), the drift correction amount calculation unit 70 calculates a correction amount for correcting a measured beam drift amount. The calculated drift correction amount is output to the deflection control circuit 120.

In the drift position correction step (S120), the drift position correction unit 122 (an example of an addition unit) inputs a drift correction amount, and adds it to the position of each TF layer for which correction has been performed for each type of a figure. Thereby, the reference position of each TF 40 for each figure type is corrected not only with respect to each figure type but also with respect to a drift amount. Therefore, in the deflection amount calculation step (S124) after the addition, the sub-deflection amount calculation unit 128 calculates a deflection amount for performing deflection by the sub deflector 209 from the reference position of an SF 30 concerned to the reference position a TF 40 concerned for which not only the position has been corrected for each figure type but also a drift amount has already been corrected.

As described above, the drift amount is corrected by correcting the position of TF 40, being the smallest deflection region, for each figure type. Thereby, it is possible to eliminate the need for correction of shot data of each shot figure for drift correction. Therefore, also with respect to beam drift correction, it is possible to avoid the increase in the calculation processing time in shot data generation for an enormous number of shot figures.

As described above, according to the first embodiment, it is possible to reverse a shaped beam while inhibiting decrease of throughput without correcting a position for beam reverse for each shot figure on shot data.

The embodiments have been explained referring to concrete examples described above. However, the present invention is not limited to these specific examples. In the example described above, calculation of a drift correction amount is performed at the control computer 110 side and addition of the drift correction amount is actually performed at the deflection control circuit 12C side, but however, it is not limited thereto. The processing from calculating a drift correction amount to actually adding the drift correction amount may be performed at the control computer 110 side.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   a first generation unit configured to generate a smallest deflection region layer in three or more deflection region layers each having deflection regions of a size different from those of other deflection region layers, for each figure type of a plurality of figure types which can be variably shaped using a first shaping aperture and a second shaping aperture;
   an assignment unit configured to assign each of a plurality of shot figure patterns to deflection regions of the smallest deflection region layer of a corresponding one of the plurality of figure types;
   a correction unit configured to perform correction to shift a position of each of the smallest deflection region layer, in accordance with a variable shaping position of the each figure type; and
   a writing unit configured to write the each of the plurality of shot figure patterns on a target object with a charged particle beam, in a state where the position of the each of the smallest deflection region layer has been corrected for the each figure type.

2. The apparatus according to claim 1, further comprising:
   a measurement unit configured to measure a drift amount of the charged particle beam which changes as time passes; and
   an addition unit configured to add a drift correction amount for correcting the drift amount to the position of the each of the smallest deflection region layer which has been corrected.

3. The apparatus according to claim 2, wherein the writing unit includes a plurality of deflectors, further comprising:
   a deflection control circuit configured to control a deflector in the plurality of deflectors which deflects the charged particle beam to a reference position of the deflection region of at least the each of the smallest deflection region layer,
   wherein the addition unit is arranged in the deflection control circuit.

4. The apparatus according to claim 2, further comprising:
   a drift correction amount calculation unit configured to calculate the drift correction amount for correcting the drift amount measured of the charged particle beam.

5. The apparatus according to claim 1, further comprising:
   a shot division unit configured to input writing data and divide a figure pattern defined in the writing data into shot figure patterns each for each shot of the charged particle beam.

6. The apparatus according to claim 1, further comprising:
   a second generation unit configured to generate a deflection region layer larger than the smallest deflection region layer in the three or more deflection region layers.

7. The apparatus according to claim 6, wherein a number of the deflection region layer generated to be larger than the smallest deflection region layer is less than a number of the smallest deflection region layer.

8. The apparatus according to claim 7, wherein the deflection region layer larger than the smallest deflection region layer is not generated for the each figure type unlike a case of the smallest deflection region layer.

9. The apparatus according to claim 6, further comprising:
   a deflection amount calculation unit configured to calculate a deflection amount for deflecting the charged particle beam from a reference position of a first deflection region of the deflection region layer larger than the smallest deflection region layer to a reference position of a second deflection region concerned of the smallest deflection region layer.

10. The apparatus according to claim 9, wherein the smallest deflection region layer of the second deflection region concerned is different for the each figure type.

11. The apparatus according to claim 10, wherein the reference position of the second deflection region concerned has been corrected for the each figure type.

12. A charged particle beam writing method comprising:
    generating a smallest deflection region layer in three or more deflection region layers each having deflection regions of a size different from those of other deflection region layers, for each figure type of a plurality of figure types which can be variably shaped using a first shaping aperture and a second shaping aperture;
    assigning each of a plurality of shot figure patterns to the deflection regions of the smallest deflection region layer of a corresponding one of the each figure type;
    correcting to shift a position of each of the smallest deflection region layer, in accordance with a variable shaping position of the each figure type; and
    writing the each of the plurality of shot figure patterns on a target object with a charged particle beam, in a state where the position of the each of the smallest deflection region layer has been corrected for the each figure type.

13. The method according to claim 12, further comprising:
   measuring a drift amount of the charged particle beam which changes as time passes; and
   adding a drift correction amount for correcting the drift amount to the position of the each of the smallest deflection region layer which has been corrected.

* * * * *